United States Patent
Hamzaoglu et al.

(10) Patent No.: US 7,403,426 B2
(45) Date of Patent: Jul. 22, 2008

(54) MEMORY WITH DYNAMICALLY ADJUSTABLE SUPPLY

(75) Inventors: Fatih Hamzaoglu, Hillsboro, OR (US); Kevin Zhang, Portland, OR (US); Nam Sung Kim, Hillsboro, OR (US); Muhammad M. Khellah, Tigard, OR (US); Dinesh Somasekhar, Portland, OR (US); Yibin Ye, Portland, OR (US); Vivek K. De, Beaverton, OR (US); Bo Zheng, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/137,905

(22) Filed: May 25, 2005

(65) Prior Publication Data

US 2006/0268626 A1 Nov. 30, 2006

(51) Int. Cl.
*G11C 11/34* (2006.01)
(52) U.S. Cl. ............. 365/185.23; 365/228; 365/189.11; 365/188
(58) Field of Classification Search ............ 365/185.23, 365/228, 189.11, 188
See application file for complete search history.

(56) References Cited

U.S. PATENT DOCUMENTS

| | | | | |
|---|---|---|---|---|
| 5,020,028 A | * | 5/1991 | Wanlass | 365/154 |
| 5,473,562 A | * | 12/1995 | Liu | 365/154 |
| 5,633,832 A | * | 5/1997 | Patel et al. | 365/230.06 |
| 5,898,610 A | | 4/1999 | Greason | |
| 6,198,682 B1 | * | 3/2001 | Proebsting | 365/207 |
| 6,442,089 B1 | | 8/2002 | Fletcher et al. | |
| 6,556,471 B2 | | 4/2003 | Chappell et al. | |
| 6,724,648 B2 | | 4/2004 | Khellah et al. | |
| 6,831,871 B2 | | 12/2004 | Khellah et al. | |
| 7,079,426 B2 | | 7/2006 | Zhang et al. | |
| 7,193,925 B2 | * | 3/2007 | Hong | 365/230.06 |
| 2003/0076708 A1 | * | 4/2003 | Hidaka | 365/171 |
| 2005/0073060 A1 | | 4/2005 | Datta et al. | |
| 2005/0078508 A1 | | 4/2005 | Chan et al. | |
| 2005/0128860 A1 | * | 6/2005 | Hidaka | 365/232 |
| 2005/0157537 A1 | | 7/2005 | Wei et al. | |
| 2005/0237850 A1 | | 10/2005 | Datta et al. | |
| 2005/0265070 A1 | | 12/2005 | Liaw | |
| 2006/0040462 A1 | | 2/2006 | Wu et al. | |
| 2006/0067134 A1 | | 3/2006 | Zhang et al. | |
| 2006/0152964 A1 | | 7/2006 | Ramaraju et al. | |
| 2007/0279966 A1 | * | 12/2007 | Houston | 365/154 |
| 2008/0037355 A1 | * | 2/2008 | Hirabayashi | 365/230.03 |

* cited by examiner

Primary Examiner—Tuan T. Nguyen
(74) Attorney, Agent, or Firm—Erik R. Nordstrom

(57) ABSTRACT

In some embodiments, a memory array is provided with cells that when written to or read from, can have modified supplies to enhance their read stability and/or write margin performance. Other embodiments may be disclosed and/or claimed.

12 Claims, 7 Drawing Sheets

MEMORY WITH DYNAMICALLY ADJUSTABLE SUPPLY

BACKGROUND

Processor-based systems such as computers and embedded devices commonly use memory devices including random access memory (RAM) devices. For example, high-performance very large scale integration (VLSI) systems generally employ large amounts of on-die SRAM for cache functions. Static RAM, or SRAM, stores data in a flip-flop that usually includes four to six transistors. As scaling of such technologies continues, particular attention is given to the performance of the SRAM as well as its die size.

Since a SRAM cell supports both read and write operations, its performance may be measured by its read stability and its write margin. The performance criteria coupled with the need to maintain a small cell area are particularly challenging for any new SRAM design. The read stability and the write margin typically make conflicting demands on the SRAM cell. During a read operation, the SRAM cell preferably has "weak disturbance" at the internal storage nodes in order to avoid being erroneously flipped (from a "1" state to a "0" state, and vice-versa). This is preferred whether a "true read," in which the contents of the cell are sent to read/write circuitry, or a so-called "dummy read," in which the read is not actually processed, takes place. On the other hand, during a write operation, a SRAM cell preferably has "strong disturbance" in order to successfully flip the cell. Thus, read stability depends on weak disturbance within the SRAM cell while write margin depends on strong disturbance within the same SRAM cell.

The apparent paradox between read and write requirements has made SRAM cell scaling difficult, and thus cell scaling is typically limited by both the read and write operations. Accordingly, it is desirable to have an SRAM memory cell that can meet both read and write stability requirements.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1A:
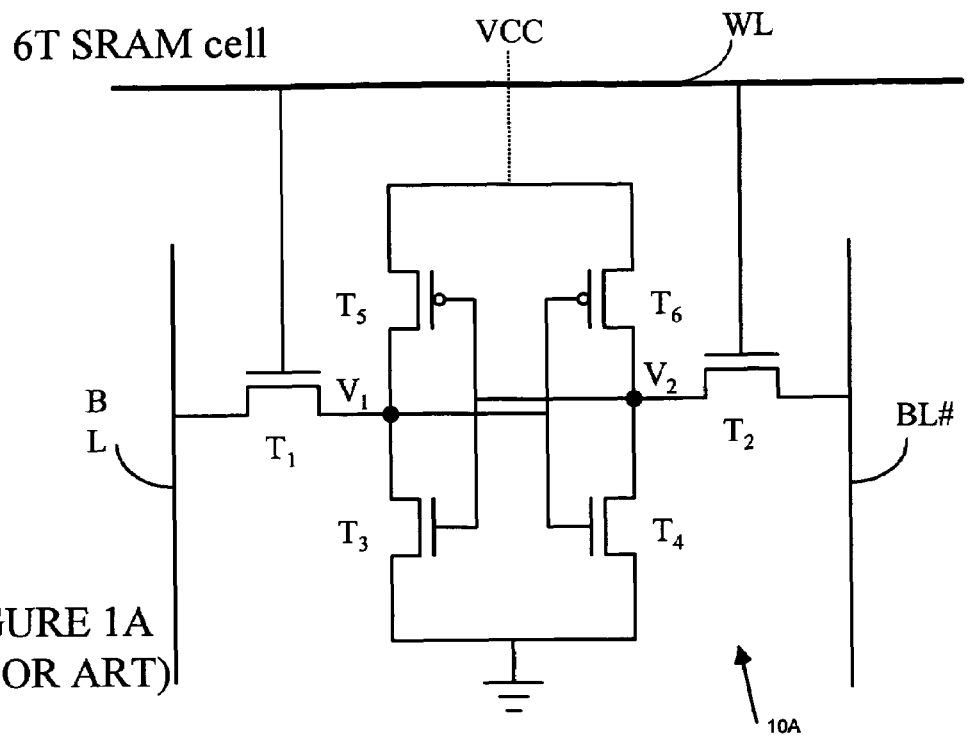
FIG. 1A is a schematic diagram of a conventional 6T SRAM cell.

With reference to FIGS. 1A, 1B, 2, and 3, SRAM memory cells 10A, 10B, and memory arrays 200, and 300, respectively, are depicted according to the prior art. FIG. 1A shows a conventional six-transistor (6T) SRAM cell 10A, while FIG. 10B shows a conventional four transistor (4T) memory cell 10B. The cell 10A includes six transistors, T1-T6. The transistors T1-T6 are metal oxide semiconductor field effect transistors (MOSFET), each including three terminals: a source terminal, a drain terminal, and a gate terminal. Transistors T1, T2, T3, and T4 are N-type MOSFETs, or NMOS transistors, while transistors T5 and T6 are P-type MOSFETs, or PMOS transistors. (It should be appreciated that whenever the terms: "transistor", "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs and oxide thicknesses to mention just a few. Moreover, unless specifically referred to as MOS or the like, the term transistor can include other suitable transistor types, e.g., junction-field-effect, bipolar-junction-transistor, known today or not yet developed.)

A supply voltage Vcc is connected to the source terminals of transistors T5 and T6. Transistors T5 and T6 control the flow of current to transistors T3 and T4 of the SRAM cell 10A. Transistors T5 and T6 are referred to herein as pull-up transistors of the SRAM cell 10A. The source terminals of transistors T3 and T4 are connected to VSS (e.g., ground but may be any suitable reference lower than VCC). Transistors T3 and T4 are referred to herein as pull-down transistors of the SRAM cell 10A. The drain terminals of transistors T5 and T6, the pull-up transistors, are coupled to the drain terminals of transistors T3 and T4, the pull-down transistors. The transistors T3, T4, T5, and T6 are coupled to one another as two back-to-back (or cross-coupled) inverters. the 4T SRAM cell 10B (FIG. 1B) is similar except that it has four transistors, with the PMOS transistors from the 6T cell replaced with resistors R1 and R2.

For either the 4t or 6T cell, a horizontal wordline, WL, is connected to the gate terminals of transistors T1 and T2. The source (or drain) terminal of transistor T1 is connected to bitline BL while the source (or drain) terminal of transistor T2 is connected to bitline BL#. (Bitlines BL and BL# are known as complementary bitlines, since one bitline transmits a "1" or "0" value while the other bitline transmits its complement, "0" or "1".) Transistors T1 and T2 are turned on by the activation of wordline WL, allowing access between the bitlines BL/BL# and the rest of the cell 10A or 10B. Transistors T1 and T2 may thus be referred to as the access transistors of a SRAM cell 10. (Note that in the depicted embodiments, NMOS transistors are used for the access transistors T1 and T2. However, PMOS transistors may alternatively be employed, although, as addressed below, will affect read/write stability differently with changes in cell and/or access transistor supply voltage.)

Figure 1B:
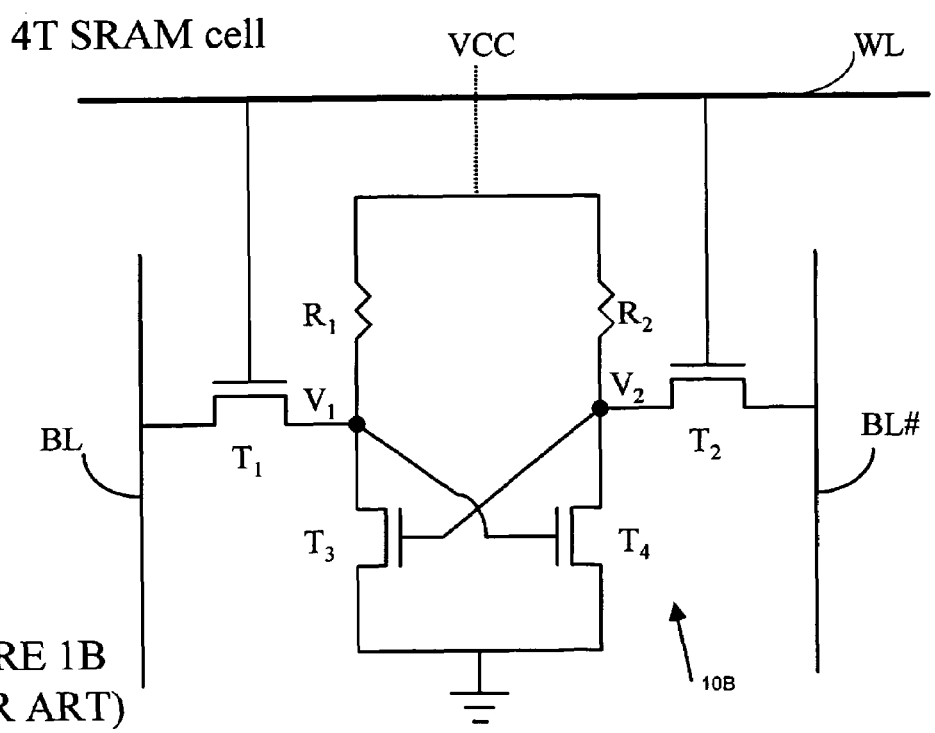
FIG. 1B is a schematic diagram of a conventional 4T SRAM cell.

The access transistors T1 and T2, when enabled, couple the bitlines BL and BL# to the complementary cell values, designated as V1 and V2 in FIGS. 1A and 1B. The SRAM cell value V1 is stored on one side of the cell (drain terminals of T3 and T5) and the complement of the cell value V2 is stored on the other side of the cell (drain terminals of T4 and T6).

Figure 2:
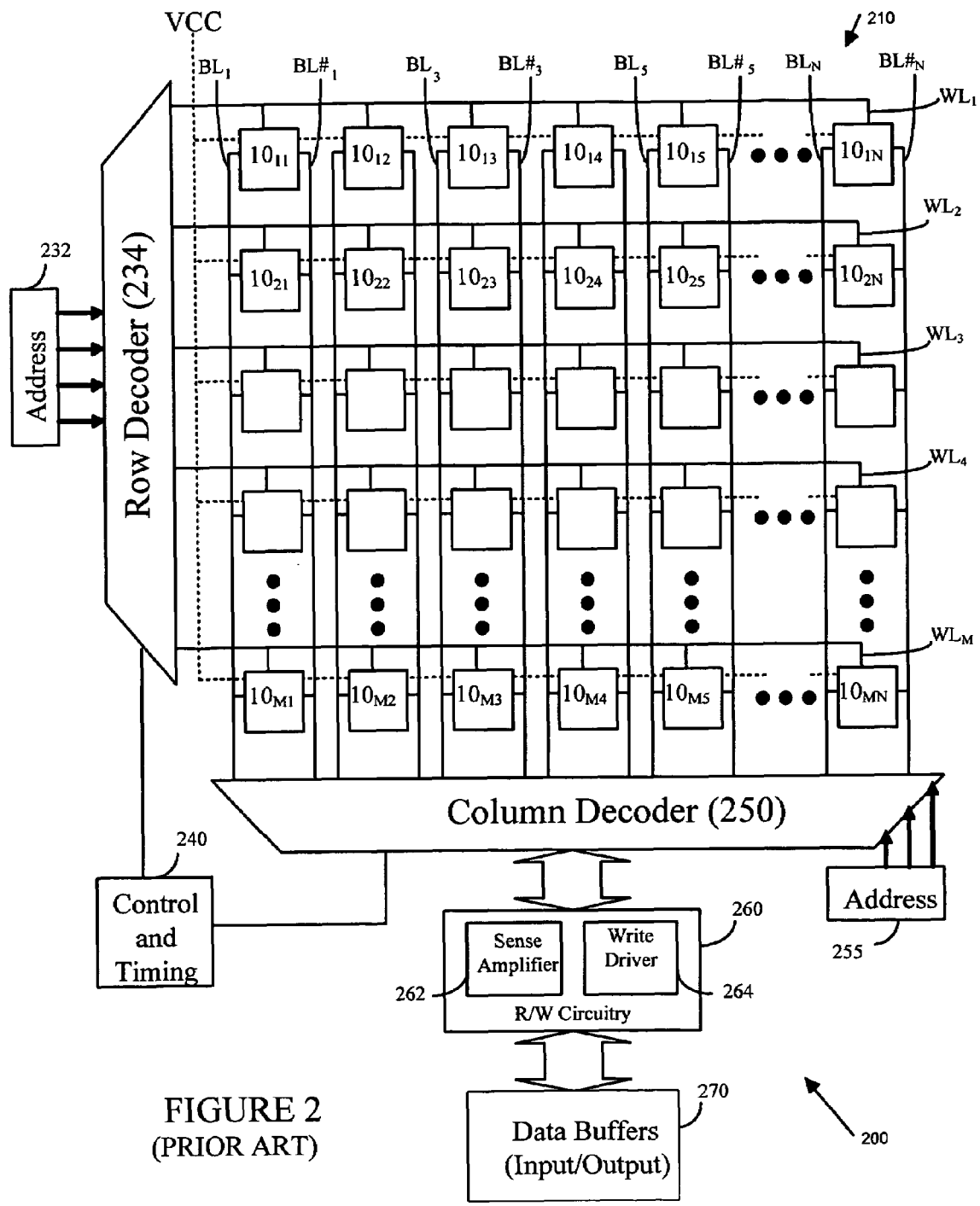
FIG. 2 is a block diagram of a conventional memory array with row-disposed supply lines.

FIG. 2 shows a conventional memory array 200 having row disposed supply lines. It comprises an M by N matrix 210 of SRAM cells 10 with M cells in each column and N cells in each row. Thus, each row may correspond to an N-bit word.

Each cell 10 in the matrix is coupled to a wordline and two complementary bitlines (BL and BL#) as shown. The M wordlines, WL1 to WLM, are connected to a row decoder 234. The row decoder 234 decodes a row address signal 232 and activates the corresponding wordline for either a read or a write operation. Accordingly, the selected wordline activates N cells 10 along the corresponding row of the memory array 200. As an example, when the wordline WL2 is activated, SRAM cells $10_{21}$, $10_{22}$ ... $10_{2N}$ are simultaneously accessible for read or write operations. Within each SRAM cell, the wordline activates the access transistors T1 and T2, which couples the corresponding bitlines BL and BL# to the internal storage of the cell.

The cell array 200 further includes a column decoder 250 coupled to the matrix 210 to decode a column address signal 255 to activate a a corresponding BL/BL# pair. Through the column decoder 250, the bitline pairs are selectively coupled to read/write (R/W) circuitry 260, which includes one or more sense amplifiers 262 (for read operations) and one or more write drivers 264 (for write operations). (Note that if each column has its own dedicated sense amplifier and write driver, the column decoder 250 may be omitted.) Depending on the implemented scheme and input column address 255, the column decoder 250 selects which column(s) is to be coupled to a sense amplifier 262 and/or write driver 264. When a read is being performed, the value stored in the cell 10 is sent to the bitline BL while the complement of the value is sent to bitline BL#. Conversely when a write is being performed, the value to be stored is sent to the bitline BL, while the complementary value is sent to the bitline BL#.

Data input/output (I/O) buffers 270 are coupled to the R/W circuitry 260. During a read operation, the column decoder 250 receives the data from the relevant bitline pair and sends the data to a sense amplifier 262, which amplifies the signal and sends it to the data I/O (output) buffers 270, for receipt by external circuitry (not shown). On the other hand, during a write operation, a write driver 264 retrieves data from the data I/O (input) buffers 270 and sends the data to the relevant bitline pair corresponding to the column address signal, as selected by the column decoder 250.

The depicted memory array 200 also comprises control and timing circuitry 240, which receives control signals such as chip select, output enable, and write enable signals. Based on such signals, the control and timing circuitry 240 controls row decoder 234, column decoder 250, and R/W circuitry 260 to control and implement a read and/or a write operation. (Note that the control and timing circuitry may actually comprise multiple and/or separate circuits but is represented in a simple, single block for ease of understanding. The same may be true for other blocks in this disclosure.)

Figure 3:
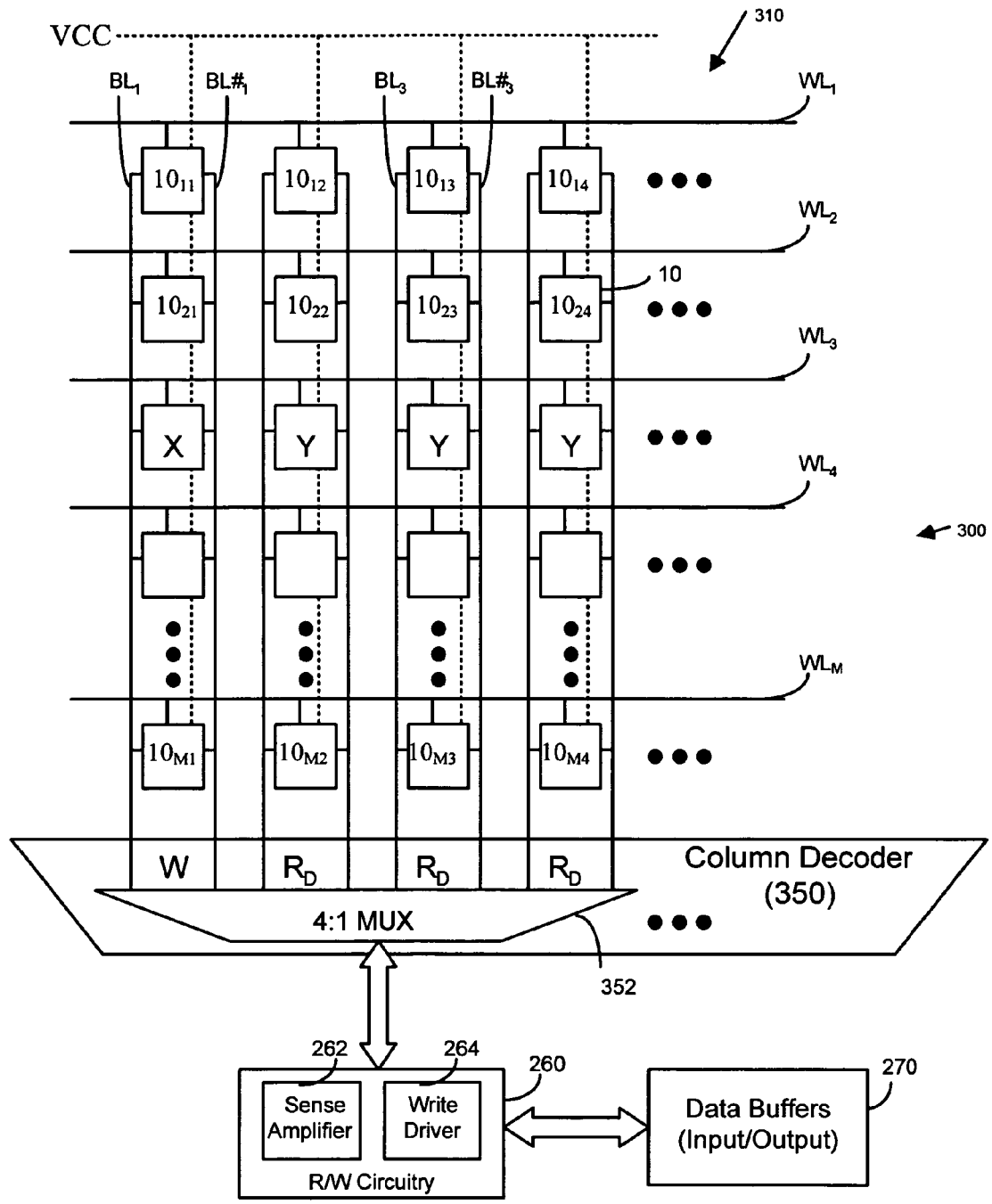
FIG. 3 is a block diagram of a conventional memory array with column disposed supply lines and employing 4:1 column interleaving.

FIG. 3 depicts a portion of a prior art memory array 300 in which column interleaving is employed. With column interleaving, multiple columns of SRAM cells share common read/write circuits while being connected to a common wordline. In other words, a single sense amplifier and a single write driver may simultaneously support multiple columns of a memory array. To support column interleaving, a column decoder with a multiplexer (or MUX) for arbitrating which column of SRAM cells, in a group of SRAM cell columns, is selected for a read or write operation. The group size is typically four, eight, or sixteen columns, but may include any number of columns. With array 300, each group has four columns and thus 4:1 column multiplexers are employed.

The memory array 300 includes a plurality of SRAM cells 10 arranged in a matrix 310. In contrast with the matrix 210 of FIG. 2, the cells in matrix 310 are disposed so that cells in a column (rather than a row) share a common VCC interconnect. Memory array 300 includes a column decoder 350 with a number of 4:1 multiplexers 352 coupled to complementary bitlines, BL/BL#, in an associated group of four columns within the matrix 310. (Although not shown, every four columns of the array are similarly driven by a separate 4:1 interleaving MUX.) Each 4:1 MUX 352 selects which of the four columns in its group is to be read from or written to, and couples the selected bitline pair to its associated read/write circuitry 260.

In operation, when a cell is to be written to or read from, a row decoder (not shown) activates the wordline for the row containing the cell. for example, if the cell marked "X" were to be written to, the row decoder would activate WL3. The access transistors for all of the cells 10 in the third row would turn on. to write to the cell marked "X", the depicted 4:1 MUX 352 would be controlled to select only the first column (within its group of four columns). A write driver 264 would then be coupled to the bitline pair $BL_1/BL\#_1$. (Each multiplexer may have its own associated read/write circuitry or share read/write circuitry with other multiplexers in the column decoder 350.) The other cells in the row (marked with a "Y") would not be written to because the depicted MUX prevents the write driver 264 from accessing their bitline pairs. Instead, the "Y" SRAM cells are said to be "dummy read". The wordline WL3 activates them, but they are not written to or actually read from. Cells 10 from other groups along the wordline WL3 would be similarly accessed via other dedicated 4:1 multiplexers (not shown). Thus, with column interleaving, different SRAM cells 10 coupled to a wordline can simultaneously experience different operating modes, e.g., a write operation to one cell and a dummy read operation from three cells.

As previously stated, there exists a paradox in the design of the SRAM cell 10, wherein the read stability and write margin performance requirements are in conflict. In general, the higher the ratio between the pull-up and access transistor strengths (with NMOS access transistors) or pull-down and access transistor strengths (with PMOS access transistors), the better the read stability but the poorer the write margin performance of a cell. For write stability (write margin performance), the opposite is true. The lower the ratio between the pull-up and access transistor strengths (with NMOS access devices) or pull-down and access transistor strengths (with PMOS access devices), the better the write margin performance of the cell. With NMOS access transistors, increasing the VCC will generally increase the relative strength of the pull-up devices and thus improve read stability (but lower write margin performance). Conversely, lowering it generally decreases relative pull-up device strength and thus improves write margin performance (but decreases read stability). Similarly, with PMOS access transistors, lowering the VSS will generally increase the relative strength of the pull-down devices and thus improve read stability (but decrease write margin performance). Conversely, increasing it will generally decrease their relative strengths and thus improve write stability (but lower read stability).

Figure 4:
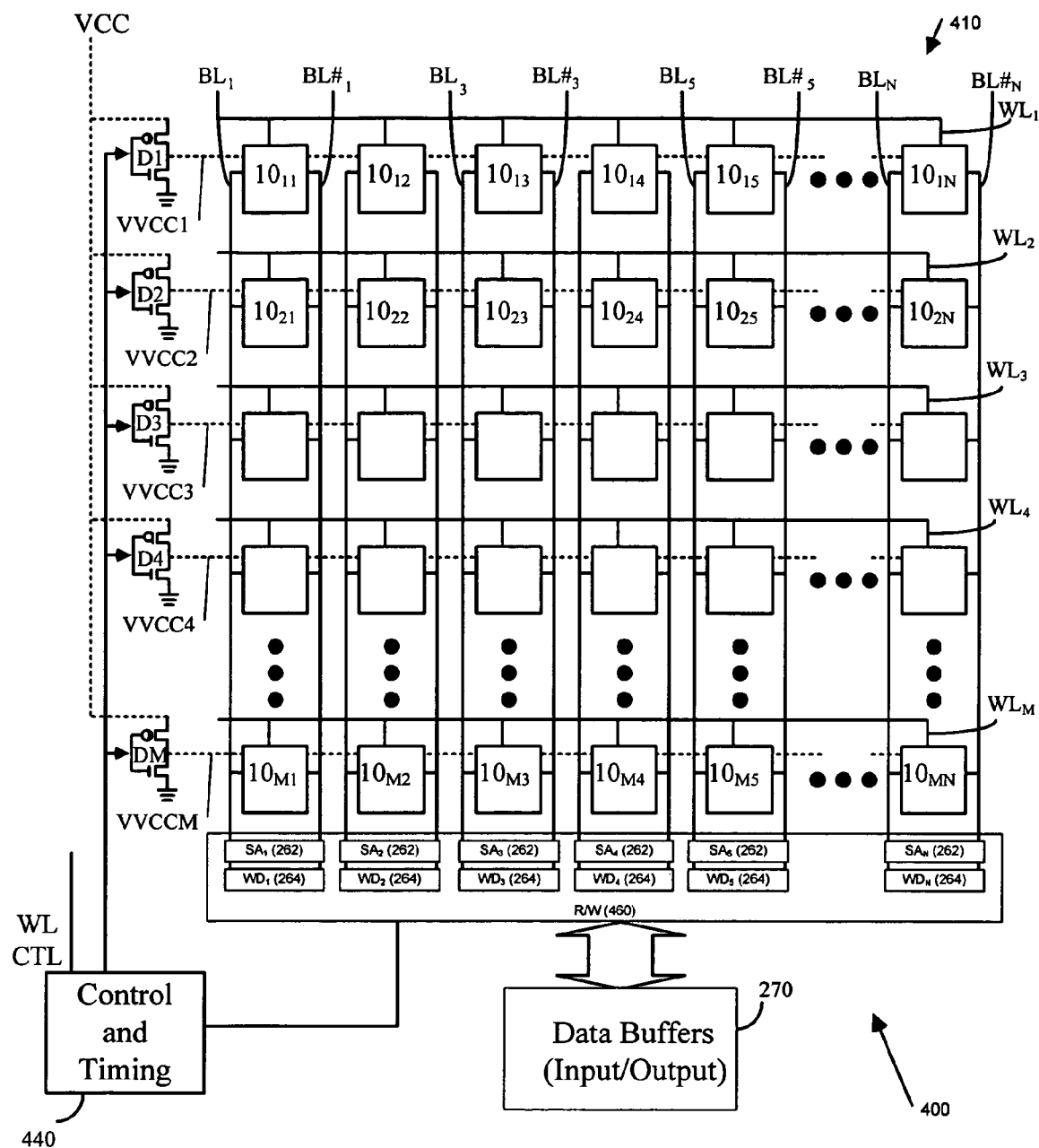
FIG. 4 is a block diagram of a memory array with dynamic, row-disposed supplies according to some embodiments of the invention.

FIG. 4 shows a memory array 400 in accordance with some embodiments of the invention. It comprises an SRAM matrix 410, a row decoder (not shown), control and timing circuit 440, read/write circuit 460, data buffers 270, and virtual supply drivers $D_1$ to $D_M$. In this embodiment, the VCC interconnects are disposed along the matrix cell rows and thus, the cells in a row share a common supply line. The cell matrix 410 is coupled to the row decoder through wordlines $WL_1$ to $WL_M$. The read/write circuitry 460 is coupled to bitline pairs $BL_1/BL\#1$ to $BL_N/BL\#_N$ through the sense amplifiers 262 and write drivers 264. (In this embodiment, a column decoder is not included since there is a separate sense amplifier and write driver for each bitline pair.) The data buffers 270 are coupled to the read/write circuitry 260 to receive therefrom read data and provide thereto data to be written.

The virtual supply drivers $D_1$ to $D_M$ (which are implemented with PMOS/NMOS inverters) are coupled between a supply voltage (VCC) and virtual VCC nodes (VVCC) for their respective rows. The control and timing circuitry 440 is coupled to the inputs (gates) of the virtual supply drivers and to the read/write circuitry 460 to control read and write operations. When de-asserted (Low input), they provide to their coupled row a virtual supply voltage VVCC that is essentially equal to VCC. Conversely, when asserted (High input), they collapse the supply voltage provided to the cells in a selected row by providing at its VVCC node a Low (e.g., ground). (In the depicted embodiment, the virtual supply drivers D1 to DN are implemented with inverters but could be implemented with any suitable switch, multiplexer, amplifier, or other controllable circuit to controllably provide a normal or a collapsed supply level. Moreover, with array 500, cells 10 with NMOS access transistors are used. The virtual supply drivers are thus coupled to VCC to modulate the VCC supply provided to the cell in order to weaken or strengthen the pull-up transistors relative to he NMOS access transistors. However, if PMOS access transistors are used, the virtual supply drivers instead could be coupled between a common VSS and virtual VSSs to strengthen or weaken pull-down devices relative to the PMOS access transistors.)

During read operations, the virtual supply drivers are de-asserted (Low input) to supply normal (or essentially normal) VCC supply levels to the memory cells in the matrix 410. However, during a write operation, the driver of the row containing the cell to be written to is asserted to collapse the voltage supplied to the row. (VCC is reduced with the use of NMOS access devices, or VSS is increased with the use of PMOS access devices.) This weakens the pull-up devices (or pull-down devices) so that the cells in the row can be easily written (even though not all of them may actually be written to). When the write operation finishes, the drivers restore the virtual VCC (or virtual VSS) to the normal VCC (or VSS) level. To avoid losing the cell states in the selected row cells not to be written to (i.e., cells in an asserted row not to be written to), in some embodiments, a write operation is performed in the following manner.

Initially, all of the cell states in a selected row are read including the cells in the unselected columns. The read states are then transferred, if necessary, to data buffers (e.g., buffers 270) that define the values to be written by write drivers 264. The value for the selected cell (cell to be written to) is replaced (if necessary) with the desired state to be written into the cell. A write operation is then performed to write the data from the write drivers 264 into the cells of the selected row (including the cell of interest). During the actual "writing" (activated write drivers and wordline), the virtual supply driver D for the selected row is asserted so that the supply voltage is collapsed, as previously discussed. After the data has been written, the driver is de-asserted and the supply voltage (VVCC) is returned to a normal VCC level. In this way, write margin performance can be enhanced, while maintaining stability for read operations and maintaining cell states in a collapsed row for cells not necessarily written to.

Figure 5:
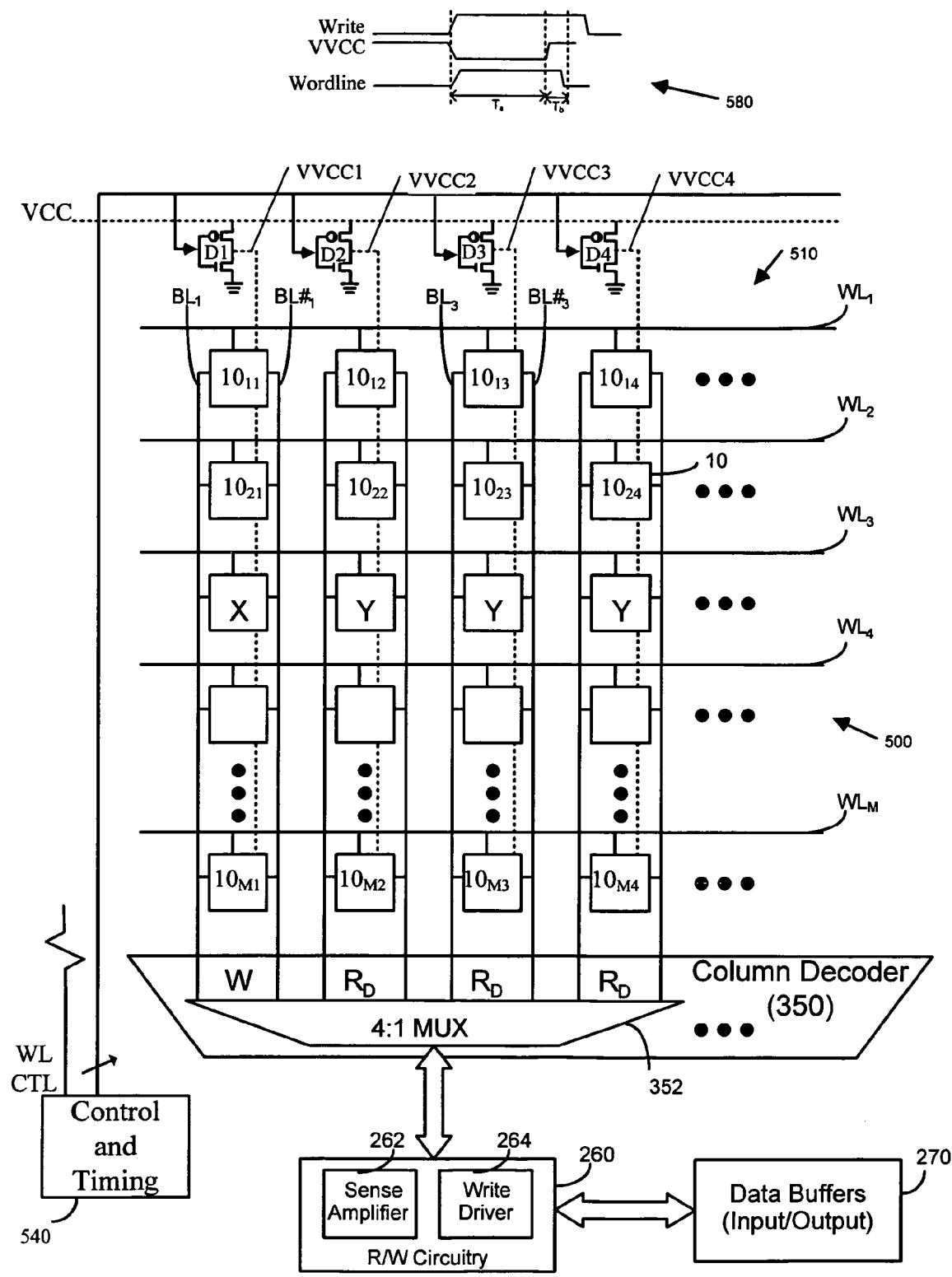
FIG. 5 is a block diagram of a memory array with dynamic, column-disposed supplies according to some embodiments of the invention.

FIG. 5 shows a memory array 500 in accordance with some embodiments of the invention. With the depicted array, instead of modulating the supply levels in selected rows, virtual supply drivers are used to modulate supply voltage levels for selected columns. As with the previous embodiments, the supply voltage for a cell to be written to is temporarily collapsed during a write operation to improve write performance margin and returned to a normal level for read operations.

Memory array 500 generally comprises an SRAM matrix 510, a row decoder (not shown), control and timing circuit 540, column decoder 350, read/write circuit 260, data buffers 270, and virtual supply drivers D1 to DN. In this embodiment, the VCC interconnect lines are disposed along the matrix cell columns and thus, the cells in a column share a common supply line. The cell matrix 510 is coupled to the row decoder through wordlines WL1 to WLM. The read/write circuitry 260, which includes sense amplifiers 262 and write drivers 264, is coupled to bitline pairs $BL_1/BL\#_1$ to $BL_N/BL\#_N$ through column decoder 350 and its interleaving multiplexers 352, as discussed above. The data buffers 270 are coupled to the read/write circuitry 260 to receive therefrom read data and provide thereto data to be written.

The virtual supply drivers D1 to DN (driver DN not shown) may be implemented as discussed with regard to FIG. 4 except that they are coupled to column rather than row supplies. They are coupled between a supply voltage VCC and virtual supply lines VVCC for their respective columns. The control and timing circuitry 540 is coupled to the inputs (gates) of the virtual supply drivers, and to the column decoder 350 and read/write circuitry 260 to control read and write operations.

The virtual supply drivers D1 to DN are implemented with inverters but could be implemented with any suitable switch, multiplexer, amplifier, or other controllable circuitry. When de-asserted (Low input), they provide to their coupled row a virtual supply voltage VVCC that is essentially equal to VCC. Conversely, when asserted (High input), they collapse the supply voltages of the cells in their column by providing a Low (e.g., ground) as the VVCC node. In some embodiments, the virtual drivers are controlled in the following manner.

During read operations, each virtual supply driver supplies a normal VCC (or VSS with PMOS access transistor implementation) to the memory cells in each column. However, during a write operation, the driver coupled to the column containing a cell to be written is asserted to collapse the voltage supplied to the cells in the selected column so that the cells in the column can be more readily written. When the write operation finishes, the asserted driver is de-asserted to restore the virtual VCC (or virtual Vss) to its normal level to avoid losing cell states in the non-written to cells.

In some embodiments, with reference to timing diagram 580 in FIG. 5, the virtual VCC (VVCC) node is restored to a normal VCC before the wordline (WL) voltage for the row of the selected cell is deactivated. This may be done to avoid destroying non-written to cell states in the selected column due to coupling between the activated wordline and internal cell nodes. In addition, the pulsing time for collapsing the supply voltage should be sufficiently small relative to cell retention times to avoid losing cell states in the non written to cells of the column.

Figure 6:
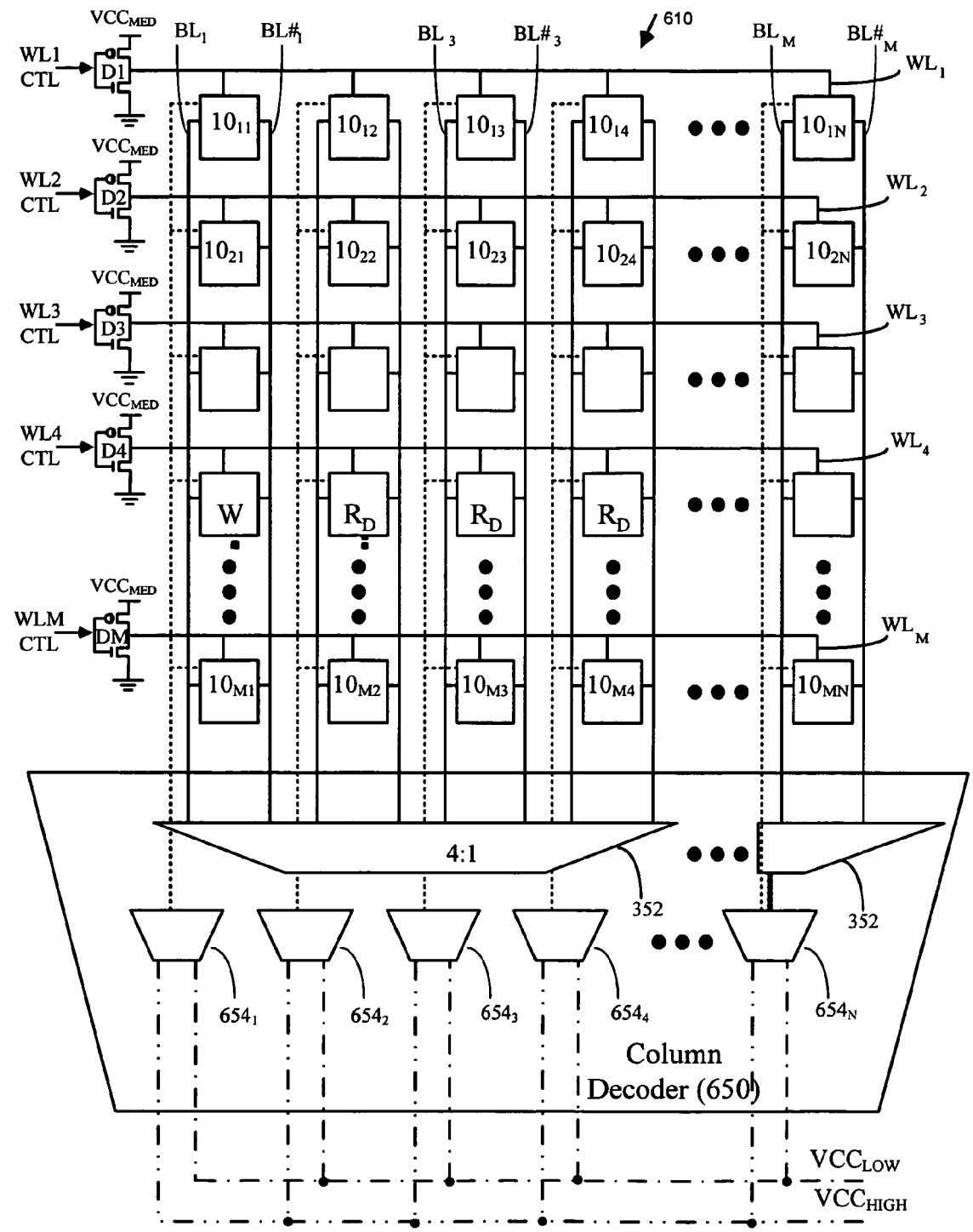
FIG. 6 is a block diagram of a multi-voltage memory array according to some embodiments of the invention.

With reference to FIG. 6, a memory array 600 is depicted according to some embodiments. with the array 600, a mid-level VCC ($VCC_{MED}$) is used to supply the wordline drivers and thus to drive the access devices via the wordlines, while one of a high supply voltage ($VCC_{HIGH}$) or low supply voltage ($VCC_{LOW}$), is applied to a selected column depending upon whether a read or write operation is being performed on a cell in the column. With both a high and a low cell supply level option, relative to the voltage supplied to the access devices, both write margin performance and read stability can be enhanced for the memory array.

Array 600 comprises an SRAM matrix 610 with cells having VCC supply lines that are disposed along its columns. Thus, as with the array 500 of FIG. 5, the supply voltages provided to its columns can be individually controlled. It has a row decoder (not shown) with wordline drivers D1 to DM coupled to wordlines $WL_1$ to $WL_M$. The wordline drivers (implemented in the depicted embodiment with PMOS/NMOS inverters) are supplied with mid-level supply voltages $VCC_{MED}$. Thus, when a wordline is activated (Low at the WL CTL driver input), the access devices in the activated row are driven with the mid-level voltage ($VCC_{MED}$) instead of a full (or normal) VCC.

Array 600 also includes a column decoder 650 with 4:1 multiplexers 352 for column interleaving (as previously discussed), along with virtual supply drivers 654 (implemented with 2:1 supply voltage multiplexers in the depicted embodiment), which are coupled to the cell columns to provide them with one of the two supply levels: $VCC_{HIGH}$ or $VCC_{LOW}$. The $VCC_{MED}$, $VCC_{HIGH}$, and $VCC_{LOW}$ voltages are relative to one another. Any suitable combination of voltage values with respect to the implemented transistors may be used. In some embodiments, the $VCC_{HIGH}$ level corresponds to a normal VCC, $VCC_{MED}$ corresponds to ⅔ VCC, and $VCCL_{OW}$ corresponds to ⅓ VCC.

In some embodiments, the supply levels are controlled in the following manner. During a write operation, the wordline for a row containing a cell to be written to is turned on with the access transistor gates being coupled to the medium supply ($VCC_{MED}$). The selected column(s) to be written are supplied (via their associated virtual supply driver 654) with the $VCC_{LOW}$ supply level, while the non-written to (read or dummy read) columns are supplied with the high ($VCC_{HIGH}$) level. This allows the cells written to cells to be flipped more easily because of the weaker cell transistors relative to the access transistors. On the other hand, the cell transistors in the non-written to columns (cells to be read or dummy read) are strengthened relative to their access transistors, which enhances their read stability.

During a read operation, since all the columns may effectively be under a read condition (either a real or dummy read), the $VCC_{HIGH}$ level is selected for all of the columns. For standby, all columns can be put under $VCC_{LOW}$ to minimize leakage (static power consumption) or $VCC_{HIGH}$ to minimize switching losses (dynamic power consumption).

Figure 7:
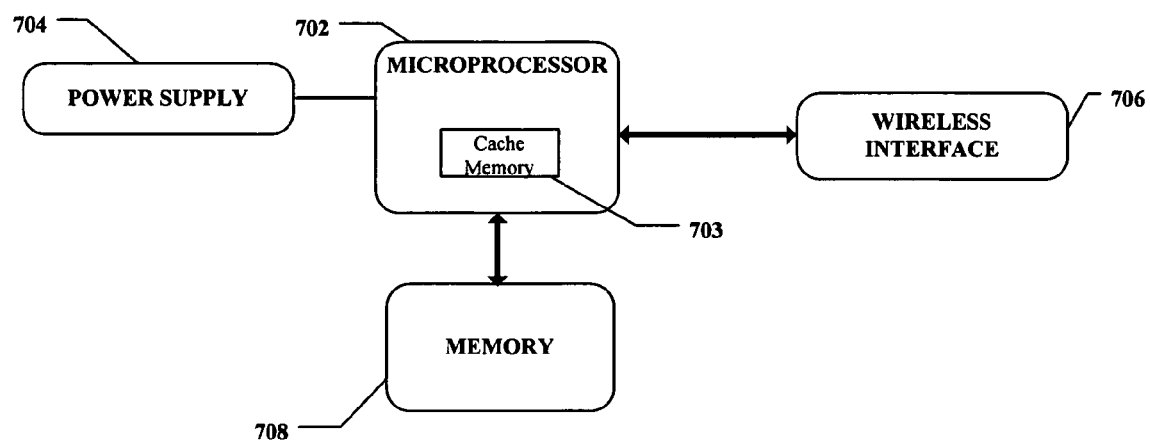
FIG. 7 is a block diagram of a computer system with a memory array in accordance with some embodiments of the invention.

With reference to FIG. 7, one example of a computer system is shown. The depicted system generally comprises a processor 702 that is coupled to a power supply 704, a wireless interface 706, and memory 708. It is coupled to the power supply 704 to receive from it power when in operation. It is coupled to the wireless interface 706 and to the memory 708 with separate point-to-point links (or alternatively, bus links) to communicate with the respective components. It includes at least one cache memory section 703 with an SRAM memory array made in accordance with an embodiment as discussed herein.

It should be noted that the depicted system could be implemented in different forms. That is, it could be implemented in a single chip module, a circuit board, or a chassis having multiple circuit boards. Similarly, it could constitute one or more complete computers or alternatively, it could constitute a component useful within a computing system.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

Moreover, it should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A circuit, comprising:
   an array comprising: a plurality of memory cells disposed in columns and rows, each column having cells coupled to a common supply line and a virtual supply driver coupled between the supply line and a supply reference to controllably provide to its column of cells at least one of a normal and a collapsed supply level, the virtual supply driver to be controlled to provide the collapsed supply level when a cell in its column is to be written, the collapsed supply level to be provided for a sufficiently small time to avoid losing states in cells of the column not to be written.

2. The circuit of claim 1, in which the array comprises a wordline in each row to controllably activate cells in a row when a cell in the row is to be written, the virtual supply driver in each column to be controlled to return from the collapsed supply level to the normal supply level before an activated wordline is de-activated.

3. The circuit of claim 1, in which the supply line is a VCC line, and the supply reference is a VCC supply voltage.

4. The circuit of claim 1, in which the supply line is a VSS line, and the supply reference is a VSS reference.

5. The circuit of claim 1, in which the collapsed supply level, when provided at the supply line of a column, causes the voltages supplied across the cells in the column to be less than ⅓ of a normal VCC supplied to the cells for at least part of the time that the supply line is at the collapsed level.

6. The circuit of claim 5, in which the collapsed supply level, when provided at the supply line of a column, causes the voltages supplied across the cells in the column to substantially approach 0V.

7. A circuit, comprising:
   an array comprising: a plurality of memory cells disposed in columns and rows each row having cells coupled to a common supply line and a virtual supply driver coupled between the supply line and a supply reference to controllably provide to the cells in its row at least one of a normal and a collapsed supply level, the array to perform a write operation by reading the row containing a cell to be written, writing back to the row the read cells except writing into the cell to be written a desired value, the virtual supply driver to be controlled to provide the collapsed supply level to the cells in its row when cells in its row when they are written to during the write operation.

8. The circuit of claim 7, in which the supply line is a VCC line, and the supply reference is a VCC supply voltage.

9. The circuit of claim 7, in which the supply line is a VSS line, and the supply reference is a VSS reference.

10. The circuit of claim 7, in which the collapsed supply level, when provided at the supply line of a row, causes the voltages supplied across the cells in the row to be less than 1/3 of a normal VCC supplied to the cells for at least part of the time that the supply line is at the collapsed level.

11. The circuit of claim 10, in which the collapsed supply level, when provided at the supply line of a row, causes the voltages supplied across the cells in the row to substantially approach 0V.

12. The circuit of claim 7, comprising at least one separate sense amplifier coupled to each column so that the cells of a row may all be read pursuant to the write operation.

* * * * *